(12) United States Patent
Kuma et al.

(10) Patent No.: US 7,956,529 B2
(45) Date of Patent: Jun. 7, 2011

(54) ORGANIC ELECTROLUMINESCENT COLOR LIGHT-EMITTING APPARATUS WITH ORGANIC ELECTROLUMINESCENT DEVICES WITH ADJUSTED OPTICAL DISTANCES BETWEEN ELECTRODES

(75) Inventors: Hitoshi Kuma, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 800 days.

(21) Appl. No.: 11/908,345

(22) PCT Filed: Mar. 7, 2006

(86) PCT No.: PCT/JP2006/304360
§ 371 (c)(1),
(2), (4) Date: Sep. 11, 2007

(87) PCT Pub. No.: WO2006/095728
PCT Pub. Date: Sep. 14, 2006

(65) Prior Publication Data
US 2009/0026921 A1    Jan. 29, 2009

(30) Foreign Application Priority Data

Mar. 11, 2005 (JP) ................ 2005-069327

(51) Int. Cl.
*H01J 1/62* (2006.01)
*H01J 63/04* (2006.01)
(52) U.S. Cl. ........ 313/504; 313/483; 313/505; 313/506; 313/503
(58) Field of Classification Search .................. None
See application file for complete search history.

(56) References Cited

U.S. PATENT DOCUMENTS

| 6,406,801 | B1 * | 6/2002 | Tokito et al. | 428/690 |
|---|---|---|---|---|
| 6,541,130 | B2 * | 4/2003 | Fukuda | 428/690 |
| 6,768,257 | B1 * | 7/2004 | Yamada et al. | 313/504 |
| 7,102,282 | B1 * | 9/2006 | Yamada et al. | 313/506 |
| 7,750,559 | B2 * | 7/2010 | Furugori | 313/504 |
| 2007/0102737 | A1 * | 5/2007 | Kashiwabara et al. | 257/291 |

FOREIGN PATENT DOCUMENTS

| JP | 11 288786 | 10/1999 |
|---|---|---|
| JP | 2000 323277 | 11/2000 |
| JP | 2001 195008 | 7/2001 |
| JP | 2004 355975 | 12/2004 |
| JP | 2005 116516 | 4/2005 |
| WO | 01 39554 | 5/2001 |

* cited by examiner

OTHER PUBLICATIONS

English machine translation of JP 2004-355975 (Shibazaki).*

*Primary Examiner* — Nimeshkumar D Patel
*Assistant Examiner* — Natalie K Walford
(74) *Attorney, Agent, or Firm* — Oblon, Spivak, McClelland, Maier & Neustadt, L.L.P.

(57) ABSTRACT

An organic electroluminescent color light-emitting apparatus including, on a supporting substrate (100), a first pixel (10) comprising a first organic electroluminescent device emitting light having an emission peak wavelength of $\lambda_1$; and a second pixel (20) comprising a second organic electroluminescent device emitting light having an emission peak wavelength of $\lambda_2$; the emission peak wavelength $\lambda_2$ being longer than $\lambda_1$; the first and second organic electroluminescent devices each being a device in which a light-reflective electrode (11), (12), an organic luminescent medium layer and a semitransparent electrode are stacked in this order in the light-outcoupling direction; and $m_1$ and $m_2$ defined by the following formula (1) satisfying the relationship of $m_2+1.3>m_1>m_2+0.7$ ($m_1$ and/or $m_2$ is an approximate integer of 0 or more).

$$m_x = \frac{2L_x}{\lambda_x} + \frac{\Phi_x}{2\pi} \quad (1)$$

6 Claims, 6 Drawing Sheets ion relates to an organic electroluminescent color light-emitting apparatus. More particularly, the invention relates to an organic electroluminescent color light-emitting apparatus which can be produced with a high degree of productivity while suppressing occurrence of a short circuit by adjusting an optical distance between an upper electrode and a bottom electrode in each pixel constituting the organic electroluminescent device, and which can emit light with a high luminous efficiency by increasing the intensity of specific light.

BACKGROUND

An organic electroluminescent device (hereinafter "electroluminescent" is abbreviated as "EL") is a device in which an organic luminescent medium layer obtained by stacking an organic carrier-transporting layer or an organic emitting layer is provided between a first electrode and a second electrode, and has been attracting attention as a self-emission type display device capable of emitting light with a high luminance at low-voltage driving.

The device structure of an organic EL device is divided into a bottom-emission structure and a top-emission structure according to the outcoupling direction of light generated in an organic emitting layer. In the top-emission structure, light is outcoupled from the upper part which is opposite to a glass substrate, in contrast to a related-art structure in which light is outcoupled through a glass substrate supporting an organic EL device (bottom-emission structure). This improves the aperture ratio with respect to an emitting part, whereby the luminance can be increased.

In an organic EL device having a top-emission structure, studies have been made to attain a high color reproducibility by using, as an upper electrode, a semitransparent cathode including a metallic thin film layer (light-reflective layer), whereby only light with a specific wavelength is intensified to be outcoupled outside an EL device due to multi-interference effects.

For example, an organic EL device is disclosed in which a light-reflective electrode, an organic luminescent medium layer including an organic emitting layer, and an electrode formed of a semitransparent metal layer and a transparent material are stacked such that the organic luminescent medium layer functions as a resonator part, and which satisfies the following formula when λ is the peak wavelength of the spectrum of light to be outcoupled (see Patent Document 1, for example)

(2L)/λ+Φ/(2π)=m wherein L is an optical distance, λ is a wavelength of light to be outcoupled, m is an integer, Φ is a phase shift at the electrode, and the optical distance L is adjusted to be minimized.

A full-color display is disclosed in which a top-emission type organic EL device and a TFT array for enabling active matrix driving of the organic EL device are used in combination (see Patent Document 2, for example).

However, in the technology described in the Patent Document 1, the thickness of an organic luminescent medium layer provided between the opposing electrodes is small since the device is configured such that the optical distance L is minimized. As a result, a short circuit tends to occur between the two electrodes due to unevenness of the surface of the light-reflective electrode as well as the underlying structure, resulting in lowered production yield of the organic EL device.

Polishing the surface of the light-reflective electrode to make it smooth is known as a technique to prevent occurrence of a short circuit between the electrodes. This technique is effective in an organic EL device having a bottom-emission structure. However, in an organic EL device with a top-emission structure, in particular, in a display in which a top-emission type organic EL device is provided on a TFT array, as disclosed in the Patent Document 2, the above-mentioned technique may cause such disadvantages as destruction of the TFT array portion due to static charges generated during polishing.

[Patent Document 1] WO01/39554
[Patent Document 2] JP-A-2001-195008

The invention has been made in view of the above-mentioned problems, and an object thereof is to provide an organic EL color light-emitting apparatus realizing a high luminous efficiency while suppressing a short circuit between the opposing electrodes.

SUMMARY OF THE INVENTION

The inventors made extensive studies to solve the above problems, and have found that a high luminous efficiency can be realized while suppressing a short circuit by allowing the thickness of an organic luminescent medium layer to differ between a pixel emitting light having the shortest wavelength and a pixel emitting light having the longest wavelength.

According to the invention, the following organic EL color light-emitting apparatus is provided.

1. An organic electroluminescent color light-emitting apparatus comprising, on a supporting substrate, a first pixel comprising a first organic electroluminescent device emitting light having an emission peak wavelength of $\lambda_1$; and a second pixel comprising a second organic electroluminescent device emitting light having an emission peak wavelength of $\lambda_2$;

the emission peak wavelength $\lambda_2$ being longer than $\lambda_1$;

the first and second organic electroluminescent devices each being a device in which a light-reflective electrode, an organic luminescent medium layer and a semitransparent electrode are stacked in this order in the light-outcoupling direction; and $m_1$ and $m_2$ defined by the following formula (1) satisfying the relationship of $m_2+1.3>m_1>m_2+0.7$ ($m_1$ and/or $m_2$ is an approximate integer of 0 or more);

$$m_x = \frac{2L_x}{\lambda_x} + \frac{\Phi_x}{2\pi} \quad (1)$$

wherein Lx is an optical distance between a light-reflective electrode and a semitransparent electrode for light having a wavelength of λx; $\Phi_x$ is the total value of phase shifts which occur when light having a wavelength of $\lambda_x$ is reflected at the surface of the light-reflective electrode and at the surface of the semitransparent electrode; and x is 1 or 2, x=1 shows a value of the first organic electroluminescent device and x=2 shows a value of the second organic electroluminescent device.

2. An organic electroluminescent color light-emitting apparatus comprising, on a supporting substrate, a first pixel comprising a first organic electroluminescent device emitting light having an emission peak wavelength of $\lambda_1$; and a second pixel comprising a second organic electroluminescent device emitting light having an emission peak wavelength of $\lambda_2$;

a third pixel comprising a third organic electroluminescent device emitting light having an emission peak wavelength of $\lambda_3$; the emission peak wavelength $\lambda_2$ being longer than $\lambda_1$ and the emission peak wavelength $\lambda_3$ being longer than $\lambda_2$;

the first, second and third organic electroluminescent devices each being a device in which a light-reflective electrode, an organic luminescent medium layer and a semitransparent electrode are stacked in this order in the light-outcoupling direction; and $m_1$ and $m_3$ defined by the following formula (2) satisfying the relationship of $m_3+1.3>m_1>m_3+0.7$ ($m_1$ and/or $m_3$ is an approximate integer of 0 or more);

$$m_x = \frac{2L_x}{\lambda_x} + \frac{\Phi_x}{2\pi} \quad (2)$$

wherein Lx is an optical distance between a light-reflective electrode and a semitransparent electrode for light having a wavelength of $\lambda_x$; $\Phi_x$ is the total value of phase shifts which occur when light having a wavelength of $\lambda_x$ is reflected at the surface of the light-reflective electrode and at the surface of the semitransparent electrode; and x is 1 or 3, x=1 shows a value of the first organic electroluminescent device and x=3 shows a value of the third organic electroluminescent device.

3. The organic electroluminescent color light-emitting apparatus according to 1 or 2, wherein the organic luminescent medium layers comprise at least a first carrier-transporting layer, an organic emitting layer and a second carrier-transporting layer stacked in this order in the light-outcoupling direction; and, in the first to third pixels, distances between the organic emitting layers and the semitransparent electrodes are almost equal.

4. The organic electroluminescent color light-emitting apparatus according to 1 or 2, wherein the organic luminescent medium layers comprise at least a first carrier-transporting layer, an organic emitting layer and a second carrier-transporting layer stacked in this order in the light-outcoupling direction; and, in the first to third pixels, distances between the light-reflective electrodes and the organic emitting layers are almost equal.

According to the organic EL color-emitting apparatus of the invention, since the thicknesses of the layers between the electrodes can be kept sufficiently thick, lowering in production yield caused by a short circuit between electrodes can be prevented and a high luminous efficiency can be realized due to light interference effects.

BEST MODE FOR CARRYING OUT THE INVENTION

First Embodiment

An organic EL color light-emitting apparatus according to the invention is described below in detail.

Figure 1:
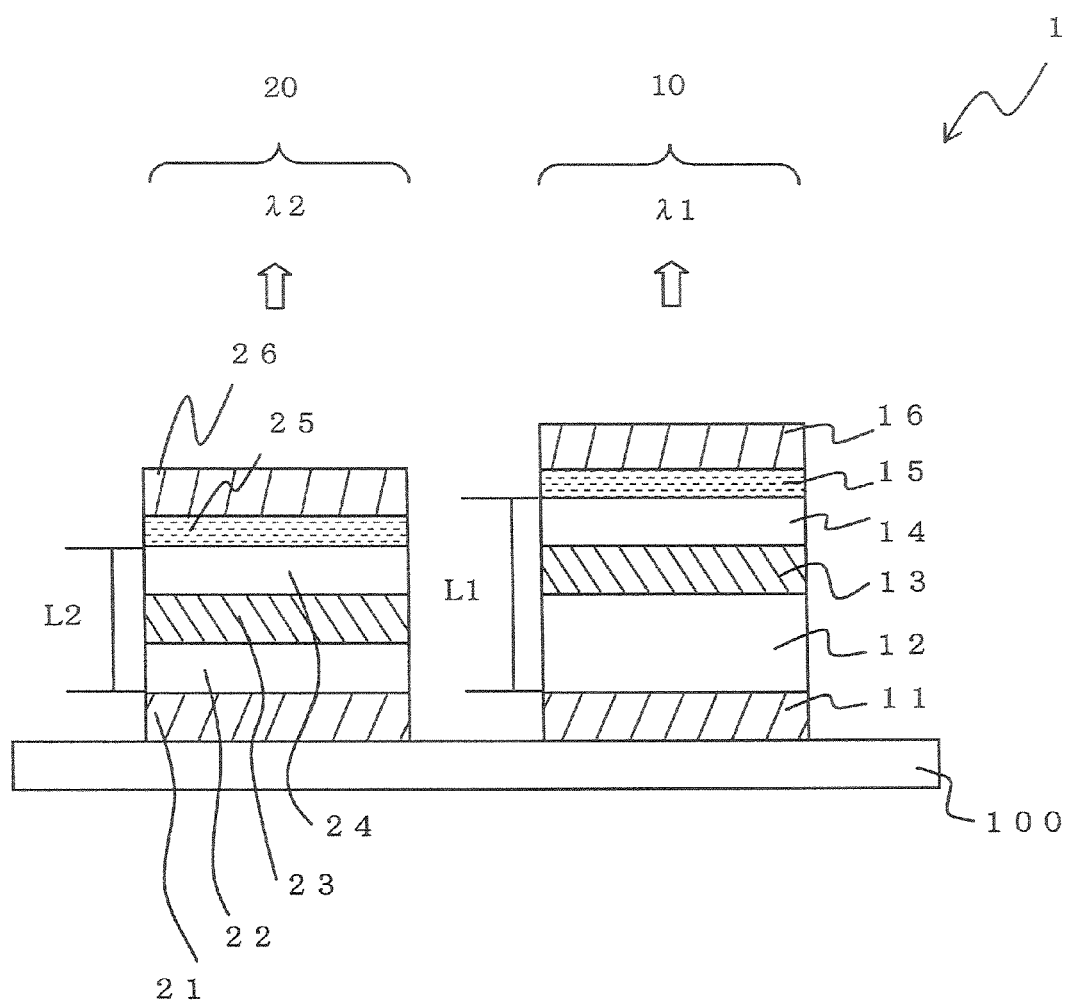
FIG. 1 is a schematic view showing an organic EL device according to a first embodiment of the invention.

FIG. 1 is a schematic view showing the organic EL color light-emitting apparatus according to the first embodiment of the invention.

The organic EL color light-emitting apparatus 1 has a first pixel 10 comprising a first organic EL device and a second pixel 20 comprising a second organic EL device, arranged laterally on a substrate 100.

The first pixel 10 has a structure in which a light-reflective electrode 11, an organic luminescent medium layer (a first carrier-transporting layer 12, an organic emitting layer 13, and a second carrier-transporting layer 14), and a semitransparent electrode obtained by stacking a light-reflective layer 15 and a transparent electrode 16 are stacked on the substrate 100 in this order.

The second pixel 20 has a structure in which a light-reflective electrode 21, an organic luminescent medium layer (a first carrier-transporting layer 22, an organic emitting layer 23, and a second carrier-transporting layer 24), and a semitransparent electrode obtained by stacking a light-reflective layer 25 and a transparent electrode 26 are stacked on the substrate 100 in this order.

The light-reflective electrodes 11 and 21 function as an electrode supplying holes or electrons, and as a layer which reflects light generated in the organic emitting layers 13 and 23 in the light-outcoupling direction (upper direction in FIG. 1). The first and second carrier-transporting layers (12, 22, 14, 24) function to transport/inject carriers (holes or electrons) supplied by the electrodes to the organic emitting layer. The organic emitting layers 13 and 23 function to recombine electrons and holes to emit light. The light-reflective layers 15 and 25 function to reflect and transmit light generated in the organic emitting layer 13. The transparent electrode layers 16 and 26 function to supply holes or electrons, as well as to transmit light generated in the organic emitting layer 13 and 23 to be outcoupled outside the device.

In the organic EL color light-emitting apparatus 1, the first pixel 10 and the second pixel 20 each have a resonator structure in which a region between the light-reflective electrodes 11, 21 and the light-reflective layers 15, 25 functions as a resonator. In a device having a resonator structure, light generated in the organic emitting layer is reflected repeatedly between two light-reflective surfaces (light-reflective electrode and light-reflective layer). In the following formula (1), when m is an approximate integer (integer ±0.2), light having a wavelength close to λx is intensified, and as a result, enhanced as compared with light having other wavelengths, and outcoupled outside the device.

$$m_x = \frac{2L_x}{\lambda_x} + \frac{\Phi_x}{2\pi} \quad (1)$$

wherein Lx is an optical distance between a light-reflective electrode and a semitransparent electrode for light having a wavelength of $\lambda_x$; $\Phi_x$ is the total value of phase shifts which occur when light having a wavelength of $\lambda_x$ is reflected at the surface of the light-reflective electrode and at the surface of the semitransparent electrode; and x is 1 or 2, x=1 shows a value of the first organic EL device and x=2 shows a value of the second organic EL device.

The optical distance Lx is the product ($nL_R$) of the refractive index n and the actual geometrical distance $L_R$ of the medium through which light passes.

The phase shift $\Phi_x$ is a value obtained by the following formula, provided that the real part of the complex refractive index is $n_0$, the imaginary part of the complex refractive index is κ, and the refractive index of the organic luminescent medium layer which is in contact with the light-reflective electrode (or the light-reflective layer) is $n_1$.

$$\Phi_x = \arctan\left(\frac{2n_1\kappa}{n_1^2 - n_0^2 - \kappa^2}\right)$$

In this embodiment, the optical distance (optical film thickness) of the first pixel 10 is expressed as L1, and the optical distance of the second pixel 20 is expressed as L2. The optical distance differs between the L1 and L2 in an amount corresponding to the thickness of the first carrier-transporting layers 12 and 22. In the first pixel 10, light having a specific wavelength λ1 is set to be enhanced so that the light is outcoupled outside the device. In the second pixel 20, light having a wavelength λ2 which is longer than λ1 is set to be enhanced so that the light is outcoupled outside the device. By such a configuration, the emission spectra of light to be outcoupled from these two pixels differ from each other, whereby multicolor emission becomes possible. The arrow in FIG. 1 indicates the outcoupling direction of light.

In the color light-emitting apparatus 1 of this embodiment, the optical distance (L1) of the first pixel 10 is set such that $m_1$ becomes 1, and the optical distance (L2) of the second pixel 20 is set such that $m_2$ becomes 0. The reason therefor is described below.

Figure 2:
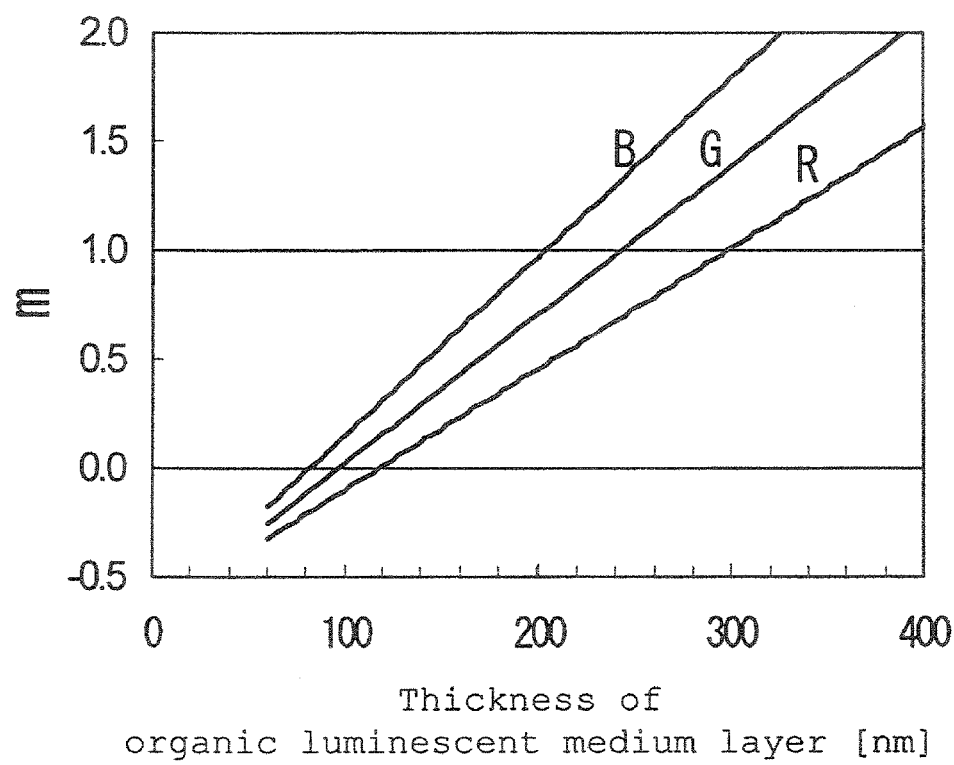
FIG. 2 is a graph showing a relationship between the thickness of the organic luminescent medium layer and m in the formula (1)

FIG. 2 is a graph showing a relationship between the film thickness of the organic luminescent medium layer and m in the formula (1).

FIG. 2 shows a relationship, which is obtained by calculation, between the film thickness of the organic luminescent medium layer x+50 (nm) and m in the formula (1) for wavelengths of 455 nm (B), 520 nm (G) and 620 nm (R) of an organic EL device which has a device configuration of an aluminum/ITO (10 nm)/hole-transporting layer (x nm)/emitting layer (30 nm)/electron-transporting layer (20 nm)/Mg:Ag alloy layer (10 nm)/ITO (100 nm).

By setting the film thickness of the organic luminescent medium layer such that the value of m becomes an approximate integer, light having a corresponding wavelength is intensified due to interference effects, whereby a high luminous efficiency can be obtained.

For example, for light having a wavelength of 455 nm which corresponds to blue light (indicated by B in FIG. 2), by setting the film thickness of the organic luminescent medium layer to about 80 nm (m=0) and about 200 nm (m=1), a high luminous efficiency can be obtained. For light having a wavelength of 520 nm which corresponds to green light (indicated by G in FIG. 2), by setting the film thickness of the organic luminescent medium layer to about 95 nm (m=0) and about 245 nm (m=1), a high luminous efficiency can be obtained. For light having a wavelength of 620 nm which corresponds to red light (indicated by R in FIG. 2), by setting the film thickness of the organic luminescent medium layer to be about 120 nm (m=0) and about 300 nm (m=1), a high luminous efficiency can be obtained.

As is apparent from FIG. 2, when m is 0, which is the smallest integer, the thickness of the organic luminescent medium layer is as thin as 100 nm or less for light having a short wavelength of 520 nm or less. It is empirically known that a short circuit tends to occur between the two electrodes if the organic luminescent medium layer has such a small thickness.

In the invention, in the first organic EL device which enhances light having a shorter wavelength λ1 to be released outside the device, by setting the optical distance (L1) such that $m_1$ in the formula (1) becomes 1, the organic EL device is imparted with a function of an optical resonator while increasing the thickness of the organic luminescent medium layer. In the second organic EL device which enhances light having a longer wavelength λ2 to be released outside the device, the optical distance (L2) is set such that $m_2$ in the formula (1) becomes 0 since the organic luminescent medium layer is thick enough even when m is 0.

As mentioned above, even when organic EL devices emitting different colors of light are arranged on the same substrate, the thickness of the organic luminescent medium layer of each device can be adjusted so as not to cause a short circuit by allowing the organic EL devices to have m values in the formula (1) differing from each other.

In an organic EL device having an optical resonator, the organic EL device can fully exhibit a function of an optical resonator when m in the formula (1) is an integer of 0 or more. When m is not an integer, the function of an optical resonator can also be exhibited as long as m is in a specific numerical range including an integer. In the invention, this range of m means that $m_1$ and $m_2$ defined by the above formula (1) satisfy the relationship of $m_2+1.3>m_1>m_2+0.7$ ($m_1$ and/or $m_2$ is an approximate integer of 0 or more). Specifically, the relationship means $m_1$ is larger than $m_2$ by 0.7 to 1.3 (an integer ±0.3).

Second Embodiment

Figure 3:
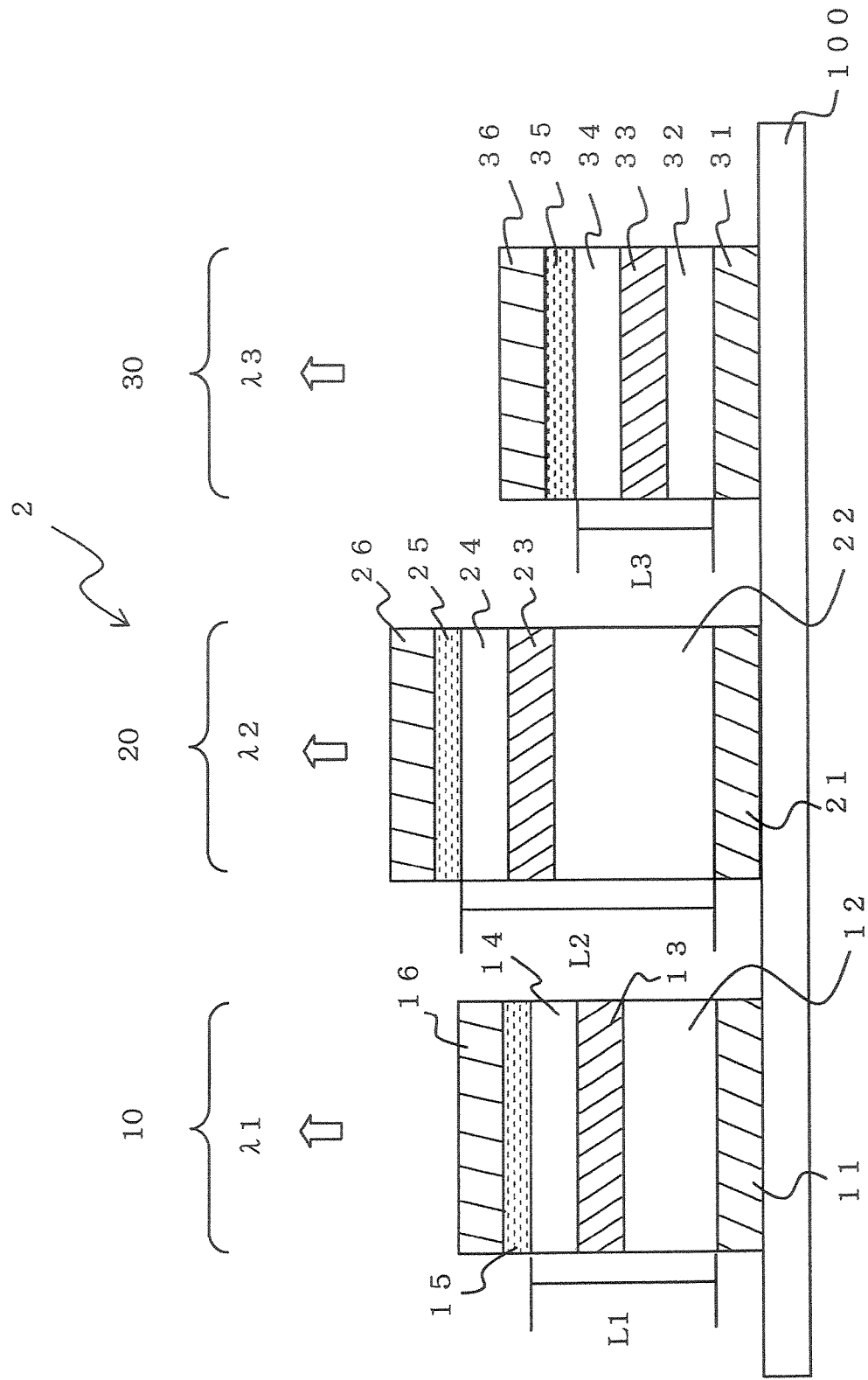
FIG. 3 is a schematic view showing an organic EL device according to a second embodiment of the invention.

FIG. 3 is a schematic view showing an organic EL color light-emitting apparatus according to the second embodiment of the invention.

In the organic EL color light-emitting apparatus 2 has a first pixel 10, a second pixel 20, and a third pixel 30 arranged laterally on a substrate 100. The first pixel 10 and the second pixel 20 are the same as those in the first embodiment 1 mentioned above, and hence, explanation is omitted here.

A third pixel 30 is formed of a third organic EL device, which has a device structure in which a light-reflective electrode 31, an organic luminescent medium layer (a first carrier-transporting layer 32, an organic emitting layer 33, and a second carrier-transporting layer 34), and a semitransparent electrode obtained by stacking a light-reflective layer 35 and a transparent electrode 36 are stacked on the substrate 100 in this order. The function of each layer is the same as that in the first embodiment mentioned above.

In the organic EL color light-emitting apparatus 2, like the first pixel 10 and the second pixel 20, the third pixel 30 has a resonator structure in which a region between the light-reflective electrode 31 and the light-reflective layer 35 functions as a resonator.

In this embodiment, the optical distance (optical thickness) of the first pixel 10, that of the second pixel 20, and that of the third pixel 30 are designated as L1, L2, and L3, respectively. The optical distance differs between the L1, L2, and L3 in an amount corresponding to the thickness of the first carrier-transporting layers 12, 22, and 32. In the first pixel 10, light having a wavelength of λ1 (e.g. light having a wavelength of 400 nm to 500 nm which is a blue emission range) is set to be enhanced so that the light is outcoupled outside the device. In the second pixel 20, light having a wavelength of λ2 which is longer than λ1 (e.g. light having a wavelength of 500 nm to 570 nm which is a green emission range) is set to be enhanced so that the light is outcoupled outside the device. In the third pixel 30, light having a wavelength of λ3 which is longer than λ2 (e.g. light having a wavelength of 570 nm to 700 nm which is a red emission range) is set to be enhanced so that the light is outcoupled outside the device. Since the emission spectra of light to be outcoupled from these three pixels differ from each other, multicolor emission becomes possible.

In this embodiment, in the first pixel 10 and the third pixel 30, $m_1$ and $m_3$ defined by the following formula (2) satisfy the relationship of $m_3+1.3>m_1>m_3+0.7$ ($m_1$ and/or $m_3$ is an approximate integer of 0 or more).

$$m_x = \frac{2L_x}{\lambda_x} + \frac{\Phi_x}{2\pi} \quad (2)$$

wherein Lx is an optical distance between a light-reflective electrode and a semitransparent electrode for light having a wavelength of $\lambda_x$; $\Phi_x$ is the total value of phase shifts which occur when light having a wavelength of $\lambda_x$ is reflected at the surface of the light-reflective electrode and at the surface of the semitransparent electrode; and x is 1 or 3, x=1 shows a value of the first organic EL device and x=3 shows a value of the third organic EL device.

In the color light-emitting apparatus 2 of this embodiment, the optical distance (L1) of the first pixel 10 is set such that $m_1$ becomes 1, and the optical distance (L3) of the third pixel 30 is set such that $m_3$ becomes 0.

By allowing $m_1$ to be larger than $m_3$ by about 1, the thickness of the first organic EL device which emits light having the shortest wavelength (blue light, for example) can be increased, whereby a short circuit between electrodes can be suppressed and performance as an optical resonator can be exhibited.

The optical distance (L2) of the second pixel 20 is set such that $m_2$ becomes an integer closer to either $m_1$ or $m_3$. In this embodiment, $m_2$ is set to 1. However, even though $m_2$ is set to 0, if the thickness of the organic luminescent medium layer is sufficiently thick, it is preferred that $m_2$ be 0 in order to reduce an applied voltage.

In the invention, in the first organic EL device, the second organic EL device, and the third organic EL device, the distances between the organic emitting layers and the semitransparent electrodes (light-reflective layers) are preferably almost equal. In the above embodiments, it is preferred that the thickness of the second carrier-transporting layers (14, 24, 34) be almost the same. By this, deposition steps after the formation of the organic emitting layer can be common for the three pixels, whereby production efficiency of the color light-emitting apparatus can be increased.

Here, the expression "almost equal" means "identical" or "identical but including a slight difference caused during production process".

In the above-mentioned embodiments, the optical distance of the organic EL device is set to differ from device to device by adjusting the thickness of the first carrier-transporting layer. Alternatively, the organic EL devices are allowed to have optical distances differing from each other by adjusting the thicknesses of the second carrier-transporting layer. In this case, considering the production process, it is preferred that the distances between the light-reflective electrodes and the organic emitting layers be almost equal. Specifically, in the above-mentioned embodiments, it is preferred that the thicknesses of the first carrier-transporting layers (12, 22, 32) be almost the same. By this, the film-forming steps just before the formation of the organic emitting layer can be common for the three pixels, resulting in increased production efficiency of the color light-emitting apparatus.

In the first organic EL device, the second organic EL device, and the third organic EL device, when the distances between the organic emitting layers and the light-reflective layers or the distances between the light-reflective electrodes and the organic emitting layers are set to be almost equal, it is preferred that the position of the organic emitting layer in each organic EL device be adjusted as explained below.

Figure 4:
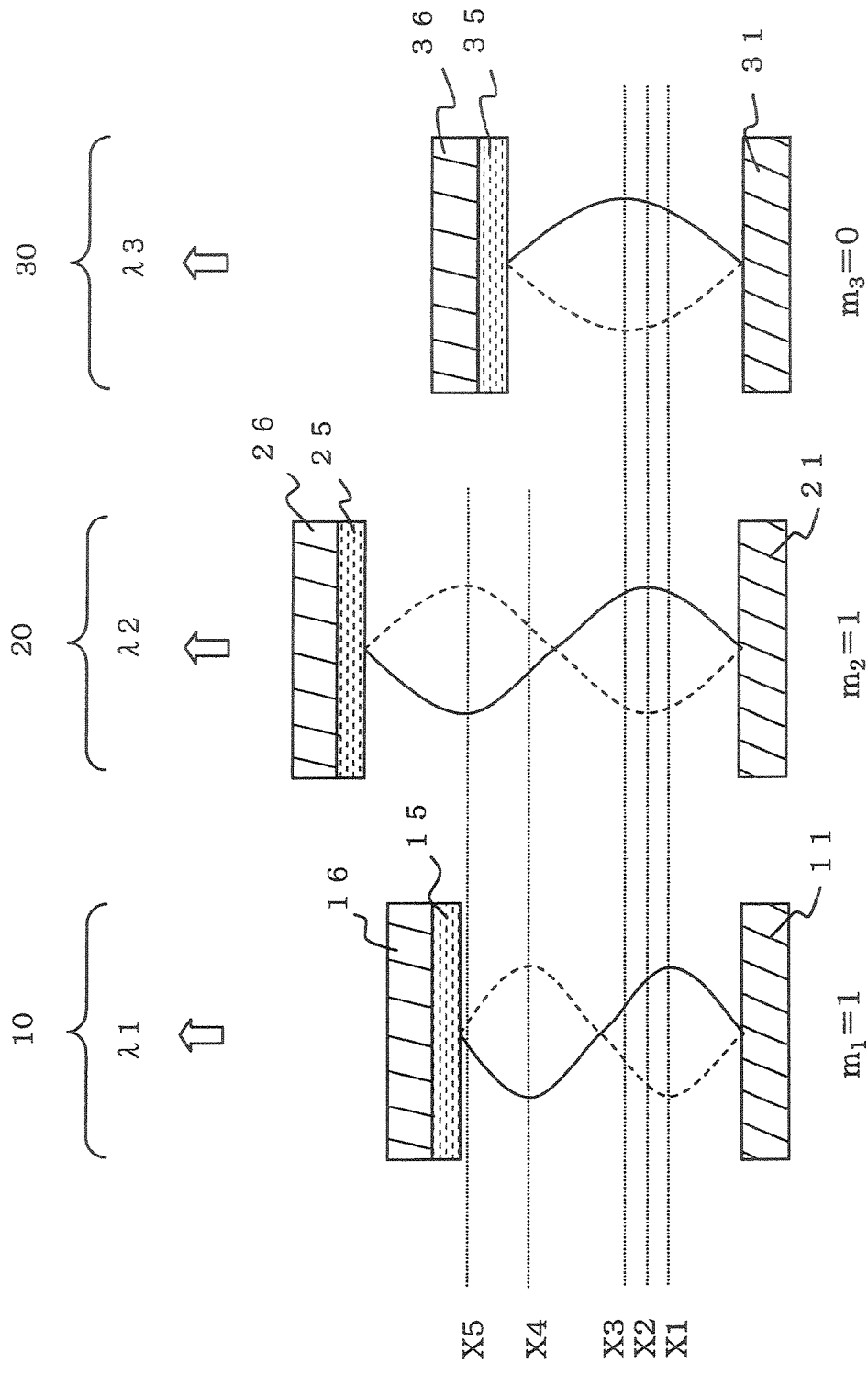
FIG. 4 is a diagrammatical view showing an optical resonator between the light-reflective electrode and the light-reflective layer of the organic EL color light-emitting apparatus according to the second embodiment.

FIG. 4 is a diagrammatical view showing an optical resonator between the light-reflective electrode and the light-reflective layer of the organic EL color light-emitting apparatus according to the second embodiment.

In the organic EL color light-emitting apparatus 2, $m_1$ of the first pixel 10 (blue pixel) is set to 1, $m_2$ of the second pixel 20 (green pixel) is set to 1, and $m_3$ of the third pixel (red pixel) is set to 0. Although both $m_1$ and $m_2$ are 1, the distance between the light-reflective electrode and the light-reflective layer of the second pixel is larger than that of the first pixel since light emitted by the second pixel 20 has a longer wavelength. In the third pixel 30, since $m_3$ is set to 0, the distance between the light-reflective electrode and the light-reflective layer is the smallest.

As mentioned above, the light generated in the organic emitting layer is intensified by repeated reflection in the optical resonator formed by the light-reflective electrode and the light-reflective layer. At this time, a standing wave is present inside the resonator as shown in FIG. 4. In FIG. 4, the solid line indicates the amplitude of light traveling in the outcoupling direction (upward direction in the figure) and the dot line indicates the amplitude of light traveling in the direction opposing to the outcoupling direction (downward direction in the figure). FIG. 4 shows how the light traveling in the outcoupling direction (solid line) and the light traveling in the direction opposing to the outcoupling direction (dashed line) are interfered with each other inside the resonator. For example, in the blue pixel (m=1), the interference strength becomes maximum at the positions of X1 and X4 in the figure, which correspond to the belly of the standing wave. In the green pixel (m=1), the positions X2 and XS in the figure correspond to the belly of the standing wave. In the red pixel (m=0), the position of X3 corresponds to the belly of the standing wave.

This means that interference strength significantly changes according to the position of the organic emitting layer inside the optical resonator even though the organic EL device is configured so as to satisfy the formula (1) or (2). For example, in the case of the blue pixel, light with the highest luminance can be obtained when the organic emitting layer is located in an area which includes the position X1 or X4. In the case of the green pixel, light with the highest luminance can be obtained when the emitting layer is located in an area which includes the position X2 or X5. In the case of the red pixel, light with the highest luminance can be obtained when the emitting layer is located in an area which includes the position X3.

Based on the idea as mentioned above, in each organic EL device, the distance between the organic emitting layer in the organic luminescent medium layer and the semitransparent electrode or the distance between the light-reflective electrode and the organic emitting layer can be set to be the same according to the position of the organic emitting layer which emits light with the highest luminance (i.e., electron-hole pair distribution in the organic emitting layer) and performance required of the color light-emitting apparatus (CIE chromaticity coordinates and luminance of each of the three primary colors).

The embodiments of the invention are described hereinabove. The above-mentioned embodiments are for a color light-emitting apparatus having a top-emission structure, however, the invention can be applied to a color light-emitting apparatus having a bottom-emission structure.

Each member constituting the color light-emitting apparatus of the invention will be described.

1. Supporting Substrate

A supporting substrate is a member which is arranged under the light-reflective electrode and functions to support an organic EL device or a TFT. Therefore, it is preferred that the supporting electrode be excellent in mechanical strength and dimensional stability. As examples of the material for the substrate, a glass plate, a metal plate, a ceramic plate, a plastic plate (e.g. polycarbonate resin, acrylic resin, vinyl chloride resin, polyethylene terephthalate resin, polyimide resin, polyester resin, epoxy resin, phenol resin, silicon resin, and fluororesin), and the like can be given.

It is preferable that the supporting substrate formed of a material which has been subjected to moisture-proof treatment or hydrophobic treatment by forming an inorganic film or applying a fluororesin in order to prevent water from entering the color light-emitting apparatus. In particular, it is preferred that the water content and gas permeability coefficient of the substrate be small to prevent water from entering the organic luminescent medium layer. In more detail, it is preferable to adjust the water content of the supporting substrate to 0.0001 wt % or less, and adjust the gas transmission coefficient to $1\times10^{-13}$ cc·cm/cm$^2$·sec·cmHg or less. In the case of an EL device having a top-emission structure, since EL emission is outcoupled from the side opposite to the supporting substrate (i.e. the semitransparent electrode side), the supporting substrate does not necessarily exhibit transparency.

2. Light-Reflective Electrode

When the anode is a light-reflective electrode, it is preferred that the light-reflective electrode be formed of a metal, an alloy, a conductive compound, or a mixture or a laminate thereof which has a low resistance and a high work function (e.g. 4.0 eV or more) since the electrode is required to have functions of supplying a voltage from a light source for driving an organic EL device and injecting holes to a hole-injecting layer.

Specifically, indium tin oxide (ITO), indium zinc oxide (IZO), CuI (cupper iodide), SnO$_2$ (tin oxide), zinc oxide, gold, silver, platinum, palladium, aluminum, chromium, nickel, and neodymium can be used singly or in combination of two or more.

When the cathode is formed of a light-reflective electrode, it is preferred that the light-reflective electrode be formed of a metal, an alloy, a conductive compound or a mixture or a laminate thereof which has a small work function (e.g. less than 4.0 eV) in order to facilitate injecting of electrons.

Specifically, magnesium, aluminum, indium, lithium, sodium, cesium, and silver can be used alone or in combination of two or more.

Also, a super thin film formed of the above-mentioned metals and a metal oxide such as aluminum oxide, or a super thin film formed of a halide of an alkaline metal such as lithium and cesium can also be used.

The thickness of the cathode layer is not particularly limited, but preferably 10 to 1,000 nm, more preferably 10 to 200 nm.

The light-reflective electrode has a reflectance for light to be outcoupled outside the device of preferably 30% or more, more preferably 50% or more.

3. Organic Luminescent Medium Layer

The organic luminescent medium layer includes an organic emitting layer, and optionally a first carrier-transporting layer and a second carrier-transporting layer. The layers included in the organic luminescent medium layer are not limited thereto, and may include a known functional layer such as an adhesion-improving layer, if need arises. Also, a layer formed of an inorganic substance may also be included.

(3-1) Organic Emitting Layer

It is preferred that a material for the organic emitting layer have the following three functions in combination.

(a) Carrier-injecting function: function of injecting holes from the anode or the hole-injecting layer, as well as injecting electrons from the cathode layer or the electron-injecting layer upon application of an electric field (b) Transporting function: function of moving injected electrons and holes due to the force of an electric field (c) Emitting function: function of providing a site for recombination of electrons and holes to emit light There are no particular restrictions on the color of emitted light as long as the light is visible light. The technique of the invention can be applied to as any color. The organic emitting layer may be a single layer or may be a stacked layer obtained by stacking two or more emitting layers which emit the same or different colors. The preferred material for the emitting layer for each color will be given below.

(A) Blue Emitting Layer

The blue emitting layer contains a host material and a blue dopant.

The host material is preferably a styryl derivative, an anthracene derivative, or an aromatic amine. The styryl derivative is in particular preferably at least one selected from distyryl derivatives, tristyryl derivatives, tetrastyryl derivatives, and styrylamine derivatives. The anthracene derivative is preferably an asymmetric anthracene compound. The aromatic amine is preferably a compound having 2 to 4 nitrogen atoms which are substituted with an aromatic group, and is in particular preferably a compound having 2 to 4 nitrogen atoms which are substituted with an aromatic group, and having at least one alkenyl group.

The asymmetric anthracene compound preferably includes compounds represented by the following formula. The methods of preparing the above-mentioned compounds or the like are described in Japanese Patent Application No. 2004-042694.

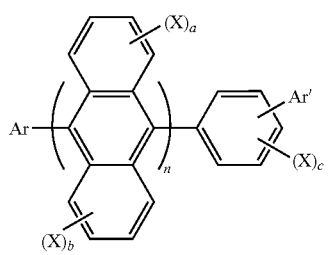

wherein Ar is a substituted or unsubstituted condensed aromatic group having 10 to 50 nucleus carbon atoms, Ar' is a substituted or unsubstituted aromatic group having 6 to 50 nucleus carbon atoms, X is a substituted or unsubstituted aromatic group having 6 to 50 nucleus carbon atoms, a substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arylthio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group.

a, b and c are independently an integer of 0 to 4; and n is an integer of 1 to 3.

Examples of the substituted or unsubstituted condensed aromatic group of Ar in the above formula include 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 3-methyl-2-naphthyl, 4-methyl-1-naphthyl, and 4-methyl-1-anthryl.

Examples of the substituted or unsubstituted aryl group for Ar', and the aryl, aromatic heterocyclic, alkyl, alkoxy, aralkyl, aryloxy, arylthio and alkoxycarbonyl for X in the above formula include the following compounds.

Examples of the substituted or unsubstituted aryl group include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, and 4''-t-butyl-p-terphenyl-4-yl.

Examples of the substituted or unsubstituted aromatic heterocyclic group include a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butyl-pyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, cyclobutyl group, cyclopropyl group, cyclopentyl group, cyclohexyl group, 4-methylcyclohexyl group, 1-adamantyl group, 2-adamantyl group, 1-norbornyl group, and 2-norbornyl group.

The substituted or unsubstituted alkoxy group is represented by —OY. Examples of Y include the same groups as the above-mentioned examples for the substituted or unsubstituted alkyl groups.

Examples of the substituted or unsubstituted aralkyl group include the above-mentioned substituted or unsubstituted aryl groups which are substituted by the above-mentioned substituted or unsubstituted alkyl groups.

The substituted or unsubstituted alkoxy group is represented by —OY'. Examples of Y' include the same groups as the above-mentioned examples for the substituted or unsubstituted aryl groups.

The substituted or unsubstituted arylthio group is represented by —SY'. Examples of Y' include the same groups as the above-mentioned examples for the substituted or unsubstituted aryl groups.

The substituted or unsubstituted alkoxycarbonyl group is represented by —COOY. Examples of Y include the same groups as the above-mentioned examples for the substituted or unsubstituted alkyl groups.

As the halogen atom, fluorine, chlorine, bromine and iodine can be given.

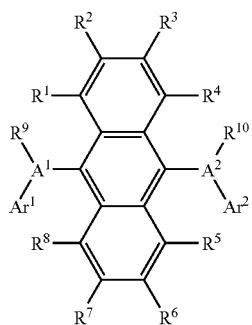

wherein $A^1$ and $A^2$ are independently a substituted or unsubstituted condensed aromatic ring group having 10 to 20 nucleus carbon atoms, $Ar^1$ and $Ar^2$ are independently a hydrogen atom or a substituted or unsubstituted aromatic ring group having 6 to 50 nucleus carbon atoms, $R^1$ to $R^{10}$ are independently a substituted or unsubstituted aryl group having 6 to 50 nucleus carbon atoms, a substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arylthio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group, provided that groups do not symmetrically bond to 9 and 10 positions of the central anthracene.

Examples of the substituted or unsubstituted condensed aromatic group for $A^1$ and $A^2$ in the above formula include the same groups mentioned above.

Examples of the substituted or unsubstituted aryl group for $Ar^1$ and $Ar^2$ in the above formula include the same groups as mentioned above.

Examples of the substituted or unsubstituted aryl group, the substituted or unsubstituted aromatic heterocyclic group, the substituted or unsubstituted alkyl group, the substituted or unsubstituted alkoxy group, the substituted or unsubstituted aralkyl group, the substituted or unsubstituted aryloxy group, the substituted or unsubstituted arylthio group and the substituted or unsubstituted alkoxycarbonyl groups for $R^1$ to $R^{10}$ in the above formula include the same groups mentioned above.

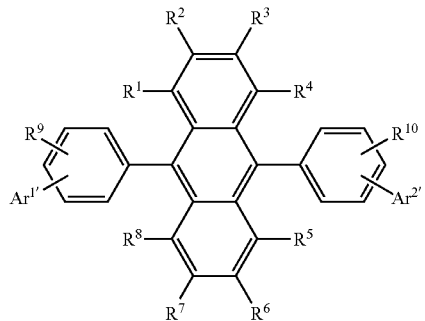

wherein $Ar^{1'}$ and $Ar^{2'}$ are independently a substituted or unsubstituted aryl group having 6 to 50 nucleus carbon atoms;

$R^1$ to $R^{10}$ are independently a substituted or unsubstituted aryl group having 6 to 50 nucleus carbon atoms, a substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arylthio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group.

Examples of the substituted or unsubstituted aryl group for $Ar^{1'}$ and $Ar^{2'}$ in the above formula include the same groups as mentioned above.

Examples of the substituted or unsubstituted aryl group, the substituted or unsubstituted aromatic heterocyclic group, the substituted or unsubstituted alkyl group, the substituted or unsubstituted alkoxy group, the substituted or unsubstituted aralkyl group, the substituted or unsubstituted aryloxy group, the substituted or unsubstituted arylthio group and the substituted or unsubstituted alkoxycarbonyl groups for $R^1$ to $R^{10}$ in the above formula include the same groups as mentioned above.

Examples of substituent for each of the above groups in the above three formulas include halogen, hydroxyl, nitro, cyano, alkyl, aryl, cycloalkyl, alkoxy, aromatic heterocycle, aralkyl, aryloxy, arylthio, alkoxycarbonyl, and carboxyl.

The blue dopant is preferably at least one selected from styrylamines, amine-substituted styryl compounds, amine-substituted condensed-aromatic-ring containing compounds, and condensed-aromatic-ring containing compounds. The blue dopant may be formed of plural different compounds. Examples of the styrylamines and amine-substituted styryl compounds are compounds represented by the following formulas (1) and (2), and examples of the condensed-aromatic-ring containing compounds are compounds represented by the following formula (3).

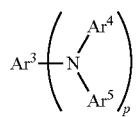  (1)

wherein $Ar^3$, $Ar^4$ and $Ar^5$ are independently a substituted or unsubstituted aromatic group having 6 to 40 carbon atoms, at least one of them contains a styryl group, and p is an integer of 1 to 3.

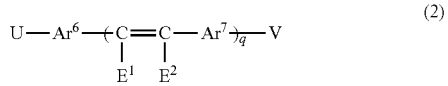  (2)

wherein $Ar^6$ and $Ar^7$ are independently an arylene group having 6 to 30 carbon atoms, $E^1$ and $E^2$ are independently an aryl or alkyl group having 6 to 30 carbon atoms, a hydrogen atom or a cyano group, q is an integer of 1 to 3, and U and/or V is a substituent containing an amino group, and the amino group is preferably an arylamino group.

  (3)

wherein A is an alkyl or alkoxy group having 1 to 16 carbon atoms, a substituted or unsubstituted aryl group having 6 to 30 carbon atoms, a substituted or unsubstituted alkylamino group having 6 to 30 carbon atoms or a substituted or unsubstituted arylamino group having 6 to 30 carbon atoms, B is a condensed aromatic group having 10 to 40 carbon atoms, and r is an integer of 1 to 4.

(B) Green Emitting Layer

The green emitting layer contains a host material and a green dopant.

As the host material, it is preferable to use the same host material used in the blue emitting layer.

The dopant is not particularly limited, and, for example, the following can be used: coumalin derivatives disclosed in EP-A-0281381, JP-A-2003-249372, and others; and aromatic amine derivatives wherein a substituted anthracene structure and an amine structure are linked to each other.

(C) Orange-to-Red Emitting Layer

An orange-to-red emitting layer contains a host material and an orange-to-red dopant.

As the host material, it is preferable to use the same host material used in the blue emitting layer.

As the dopant, a fluorescent compound having at least one fluoranthene skeleton or perylene skeleton, for example, compounds represented by the following formula can be used:

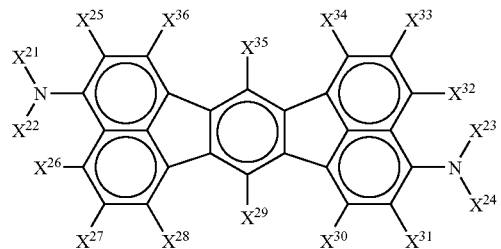

wherein $X^{21}$ to $X^{24}$ are independently an alkyl group having 1 to 20 carbon atoms, a substituted or unsubstituted aryl group having 6 to 30 carbon atoms; $X^{21}$ and $X^{22}$ and/or $X^{23}$ and $X^{24}$ may be bonded to each other with a carbon-to-carbon bond, —O— or —S— being interposed therebetween; $X^{25}$ to $X^{36}$ are independently a hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms; and adjacent substituents and $X^{25}$ to $X^{36}$ may be bonded together to form a ring structure. At least one of the substituents $X^{25}$ to $X^{36}$ in each of the formulas preferably contains amine or alkenyl.

The thickness of the organic emitting layer is preferably 5 nm to 5 μm. If the thickness of the organic emitting layer is less than 5 nm, luminance and durability may be decreased. If the thickness of the organic emitting layer exceeds 5 μm, a high voltage may have to be applied to the device. The thickness of the organic emitting layer is more preferably 10 nm to 3 μm, and still more preferably 20 nm to 1 μm.

(3-2) First Carrier-Transporting Layer and Second Carrier-Transporting Layer

The first carrier-transporting layer and the second carrier-transporting layer is either a hole-transporting layer or an electron-transporting layer. As mentioned above, if the anode is the light-reflective electrode, the first carrier-transporting layer and the second carrier-transporting layer function as the hole-transporting layer and the electron-transporting layer, respectively. On the other hand, if the cathode is the light-reflective electrode, the first carrier-transporting layer and the second carrier-transporting layer function as the electron-transporting layer and the hole-transporting layer, respectively.

The first carrier-transporting layer and the second carrier-transporting layer may be either a single layer or a stacked layer formed of two or more layers. For example, the carrier-transporting layer may be of a double-layer structure of the hole(electron)-transporting layer and the hole(electron)-injecting layer.

As the material for the hole-transporting layer, the material can be arbitrarily selected from materials which have been widely used as a hole-transporting material in photoconductive materials and known materials used in a hole-injecting layer of organic EL devices. The material for the hole-transporting layer may have either hole-transporting properties or electron-barrier properties, and may be either an inorganic substance or an organic substance.

The hole-transporting layer is preferably made of a material that can transport holes to the emitting layer at a lower electric field intensity. Namely, the hole mobility thereof is preferably $10^{-4}$ cm$^2$/V·second or more when an electric field of $10^4$ to $10^6$ V/cm is applied.

Specific examples include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232, 103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

As the material for the electron-transporting layer, the material can be arbitrarily selected from known compounds, insofar as the material has a function of transporting electrons injected from the cathode to the emitting layer.

The thickness of electron-transporting layer may be properly selected from several nm to several μm but is preferably selected such that the electron mobility is $10^{-5}$ cm$^2$/Vs or more when an electric field of $10^4$ to $10^6$ V/cm is applied The material used in the electron-transporting layer is preferably a metal complex of 8-hydroxyquinoline or a derivative thereof.

As specific examples of the metal complex of 8-hydroxyquinoline or its derivative, metal chelate oxinoid compounds (Alq, for example) including a chelate of oxine (8-quinolinol or 8-hydroxyquinoline) can be given.

An electron-transporting compound of the following general formula can be given as the oxadiazole derivative.

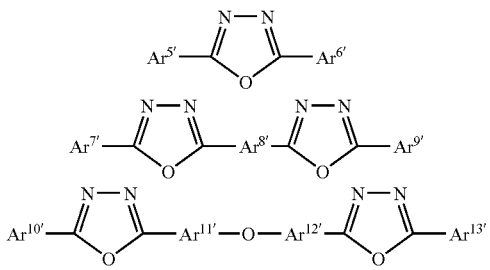

wherein $Ar^{5'}$, $Ar^{6'}$, $Ar^{7'}$, $Ar^{9'}$, $Ar^{10'}$ and $Ar^{13'}$ are independently a substituted or unsubstituted aryl group and may be the same or different, and $Ar^{8'}$, $Ar^{11'}$ and $Ar^{12'}$ are independently a substituted or unsubstituted arylene group and may be the same or different.

As examples of the aryl group, a phenyl group, a biphenyl group, an anthranyl group, a perylenyl group, and a pyrenyl group can be given. As examples of the arylene group, a phenylene group, a naphthylene group, a biphenylene group, an anthranylene group, a perylenylene group, a pyrenylene group, and the like can be given. As the substituent, an alkyl group having 1 to 10 carbon atoms, an alkoxy group having 1 to 10 carbon atoms, a cyano group, and the like can be given. The electron-transporting compound is preferably one from which a thin film can be formed.

The following compounds can be given as specific examples of the electron-transporting compound.

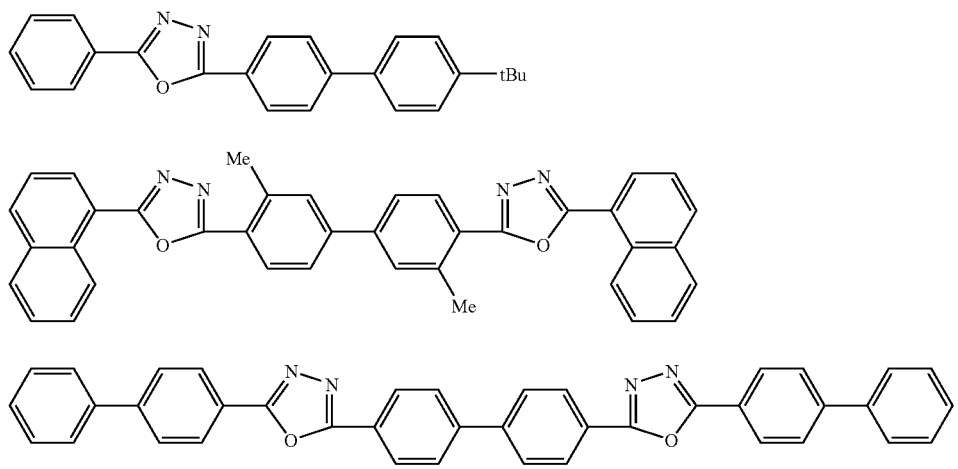

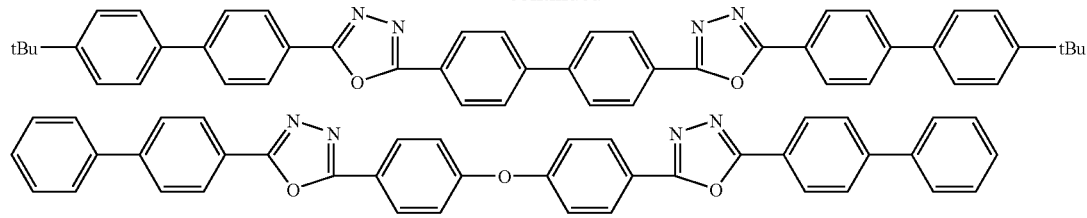

Me is methyl and tBu is t-butyl

Nitrogen-containing heterocyclic ring derivatives of the following formulas

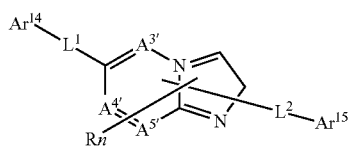

wherein $A^{3'}$ to $A^{5'}$ are a nitrogen atom or a carbon atom,

R is an aryl group having 6 to 60 carbon atoms which may have a substituent, a heteroaryl group having 3 to 60 carbon atoms which may have a substituent, an alkyl group having 1 to 20 carbon atoms, a haloalkyl group having 1 to 20 carbon atoms, or an alkoxy group having 1 to 20 carbon atoms, and n is an integer of 0 to 5, provided that, when n is an integer of 2 or more, Rs may be the same or different, adjacent Rs may be bonded to form a substituted or unsubstituted carbocyclic aliphatic ring or a substituted or unsubstituted carbocyclic aromatic ring, $Ar^{14}$ is an aryl group having 6 to 60 carbon atoms which may have a substituent or a heteroaryl group having 3 to 60 carbon atoms which may have a substituent, $Ar^{15}$ is a hydrogen atom, an alkyl group having 1 to 20 carbon atoms, a haloalkyl group having 1 to 20 carbon atoms, an alkoxy group having 1 to 20 carbon atoms, an aryl group having 6 to 60 carbon atoms which may have a substituent, or a heteroaryl group having 3 to 60 carbon atoms which may have a substituent, provided that one of $Ar^{14}$ and $Ar^{15}$ is a condensed ring group having 10 to 60 carbon atoms which may have a substituent or a heterocondensed ring group having 3 to 60 carbon atoms which may have a substituent, $L^1$ and $L^2$ are independently a single bond, a condensed ring having 6 to 60 carbon atoms which may have a substituent, a heterocondensed ring having 3 to 60 carbon atoms which may have a substituent or a fluorenylene group which may have a substituent.

Nitrogen-containing heterocyclic ring derivatives of the following formulas

HAr-$L^3$-$Ar^{16}$—$Ar^{17}$ wherein HAr is a nitrogen-containing heterocyclic ring having 3 to 40 carbon atoms which may have a substituent, $L^3$ is independently a single bond, a condensed ring having 6 to 60 carbon atoms which may have a substituent, a heteroarylene having 3 to 60 carbon atoms which may have a substituent or a fluorenylene group which may have a substituent, $Ar^{16}$ is a divalent hydrocarbon group having 6 to 60 carbon atoms which may have a substituent, and $Ar^{17}$ is an aryl group having 6 to 60 carbon atoms which may have a substituent or a heteroaryl group with 3 to 60 carbon atoms which may have a substituent.

An EL device using a silacyclopentadiene derivative represented by the following formula disclosed in JP-A-09-087616:

wherein $Q^1$ and $Q^2$ are independently a saturated or unsaturated hydrocarbon group, an alkoxy group, an alkenyloxy group, an alkinyloxy group, a hydroxyl group, a substituted or unsubstituted aryl group, a substituted or unsubstituted heterocycle or a saturated or unsaturated ring formed by bonding of $Q^1$ and $Q^2$, $R^{11}$ to $R^{14}$ are independently a hydrogen atom, a halogen atom, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkinyl group, a nitro group, a formyl group, a nitroso group, a formyloxy group, an isocyano group, a cyanate group, an isocyanate group, a thiocyanate group, an isothiocyanate group, or a cyano group; adjacent atoms or groups may form a substituted or unsubstituted condensed ring structure.

Silacyclopentadiene derivative represented by the following formula disclosed in JP-A-09-194487:

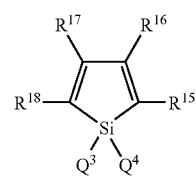

wherein $Q^3$ and $Q^4$ are independently a saturated or unsaturated hydrocarbon group having 1 to 6 carbon atoms, an alkoxy group, an alkenyloxy group, an alkinyloxy group, a substituted or unsubstituted aryl group, a substituted or unsubstituted heterocycle, or a saturated or unsaturated ring formed by bonding of $Q^3$ and $Q^4$, $R^{15}$ to $R^{18}$ are independently a hydrogen atom, a halogen atom, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyl group, a sulfinyl group, a sulfonyl group, a sulfanyl group, a silyl group, a carbamoyl group, an aryl group, a heterocyclic group, an alkenyl group, an alkinyl group, a nitro group, a formyl group, a nitroso group, a formyloxy group, an isocyano group, a cyanate group, an isocyanate group, a thiocyanate group, an isothiocyanate group, or a cyano group; adjacent atoms or groups may form a substituted or unsubstituted condensed ring, provided that, when $R^{15}$ and $R^{18}$ are phenyl, $Q^3$ and $Q^4$ are not alkyl or phenyl, when $R^{15}$ and $R^{18}$ are thienyl, there is no case where $Q^3$ and $Q^4$ are a monovalent hydrocarbon group and $R^{16}$ and $R^{17}$ are an alkyl group, an aryl group, an alkenyl group or an aliphatic group forming a ring by bonding of $R^{16}$ and $R^{17}$ when $R^{15}$ and $R^{18}$ are a silyl group, $R^{16}$, $R^{17}$, $Q^3$ and $Q^4$ are independently not a monovalent hydrocarbon atom having 1 to 6 carbon atoms or a hydrogen atom, and $Q^3$ and $Q^4$ are not an alkyl group and a phenyl group in the case of a structure where a benzene ring is condensed at $R^{15}$ and $R^{16}$.

Borane derivatives of the following formula disclosed in JP-T-2000-040586:

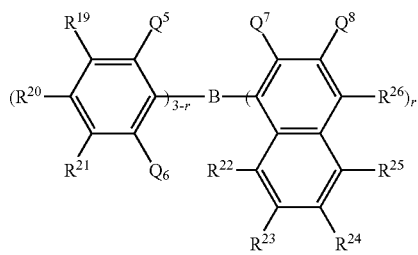

wherein $R^{19}$ to $R^{26}$ and $Q^8$ are independently a hydrogen atom, a saturated or unsaturated hydrocarbon group, an aromatic group, a heterocyclic group, a substituted amino group, a substituted boryl group, an alkoxy group, or an aryloxy group, $Q^5$, $Q^6$, and $Q^7$ are independently a saturated or unsaturated hydrocarbon group, an aromatic group, a heterocyclic group, a substituted amino group, an alkoxy group, or an aryloxy group, the substituent for $Q^7$ and $Q^8$ may be bonded to form a condensed ring, r is an integer of 1 to 3, provided that the $Q^7$s may differ when r is 2 or more, and a case in which r is 1, $Q^5$, $Q^6$, and $R^{20}$ are methyl groups, and $R^{26}$ is a hydrogen atom or a substituted boryl group, and a case in which r is 3 and $Q^7$ is a methyl group are excluded.

Compounds represented by the following formula disclosed in JP-A-10-088121

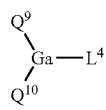

wherein $Q^9$ and $Q^{10}$ are independently ligands of the following formula, $L^4$ is a halogen atom, a substituted or unsubstituted alkyl group, a substituted or unsubstituted cycloalkyl group, a substituted or unsubstituted aryl group, a substituted or unsubstituted heterocyclic group, —$OR^{27}$ ($R^{27}$ is a hydrogen atom, a substituted or unsubstituted alkyl group, a substituted or unsubstituted cycloalkyl group, a substituted or unsubstituted aryl group, or a substituted or unsubstituted heterocyclic group), or —O—Ga-$Q^{11}(Q^{12})$ ($Q^{11}$ and $Q^{12}$ have the same meanings as $Q^9$ and $Q^{10}$)

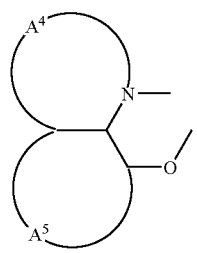

wherein rings $A^4$ and $A^5$ are independently a 6-membered aryl ring structure which may have a substituent, and are condensed to each other.

The metal complexes have the strong nature of an n-type semiconductor and large ability of injecting electrons. Further, the energy generated at the time of forming a complex is small, and hence, a metal is then strongly bonded to ligands in the complex formed and the fluorescent quantum efficiency becomes large as the emitting material.

Specific examples of the substituent for the rings $A^4$ and $A^5$ forming the ligand of the above formula include halogen atoms such as chlorine, bromine, iodine, and fluorine, substituted or unsubstituted alkyl groups such as a methyl group, ethyl group, propyl group, butyl group, sec-butyl group, tert-butyl group, pentyl group, hexyl group, heptyl group, octyl group, stearyl group, and trichloromethyl group, a substituted or unsubstituted aryl groups such as a phenyl group, naphthyl group, 3-methylphenyl group, 3-methoxyphenyl group, 3-fluorophenyl group, 3-trichloromethylphenyl group, 3-trifluoromethylphenyl group, and 3-nitrophenyl group, a substituted or unsubstituted alkoxy groups such as a methoxy group, n-butoxy group, tert-butoxy group, trichloromethoxy group, trifluoroethoxy group, pentafluoropropoxy group, 2,2,3,3-tetrafluoropropoxy group, 1,1,1,3,3,3-hexafluoro-2-propoxy group, and 6-(perfluoroethyl)hexyloxy group, a substituted or unsubstituted aryloxy groups such as a phenoxy group, p-nitrophenoxy group, p-tert-butylphenoxy group, 3-fluorophenoxy group, pentafluorophenyl group, and 3-trifluoromethylphenoxy group, a substituted or unsubstituted alkylthio groups such as a methylthio group, ethylthio group, tert-butylthio group, hexylthio group, octylthio group, and trifluoromethylthio group, a substituted or unsubstituted arylthio groups such as a phenylthio group, p-nitrophenylthio group, p-tert-butylphenylthio group, 3-fluorophenylthio group, pentafluorophenylthio group, and 3-trifluoromethylphenylthio group, a cyano group, a nitro group, an amino group, mono-or di-substituted amino groups such as a methylamino group, diethylamino group, ethylamino group, diethylamino group, dipropylamino group, dibutylamino group, and diphenylamino group, acylamino groups such as a bis(acetoxymethyl) amino group, bis(acetoxyethyl) amino group, bis(acetoxypropyl)amino group, and bis(acetoxybutyl)amino group, a hydroxyl group, a siloxy group, an acyl group, a carbamoyl group such as a methylcarbamoyl group, dimethylcarbamoyl group, ethylcarbamoyl group, diethylcarbamoyl group, propylcarbamoyl group, butylcarbamoyl group, and phenylcarbamoyl group, a carboxylic acid group, a sulfonic acid group, an imide group, cycloalkyl groups such as a cyclopentane group and a cyclohexyl group, aryl groups such as a phenyl group, naphthyl group, biphenyl group, anthranyl group, phenanthryl group, fluorenyl group, and pyrenyl group, heterocyclic groups such as a pyridinyl group, pyrazinyl group, pyrimidinyl group, pyridazinyl group, triazinyl group, indolinyl group, quinolinyl group, acridinyl group, pyrrolidinyl group, dioxanyl group, piperidinyl group, morpholidinyl group, piperazinyl group, triathinyl group, carbazolyl group, furanyl group, thiophenyl group, oxazolyl group, oxadiazolyl group, benzooxazolyl group, thiazolyl group, thiadiazolyl group, benzothiazolyl group, triazolyl group, imidazolyl group, benzimidazolyl group, pranyl group, and the like. The above substituents may be bonded to form a six-membered aryl ring or heterocyclic ring.

4. Semitransparent Electrode

As the semitransparent electrode, an electrode obtained by stacking a light-reflective layer and a light-reflective transparent layer formed of materials exemplified as the material for the light-reflective electrode, or an electrode formed only of a light-reflective layer. When the anode is the light-reflective electrode, the cathode is the semitransparent electrode. When the cathode is the light-reflective electrode, the anode is the semitransparent electrode.

The light-reflective layer has a function of receiving carriers from one surface and releasing carriers from the other surface. Therefore, the light-reflective layer is required to exhibit not only light reflectivity but also conductivity. For that reason, it is preferred that the light-reflective layer be formed of a metal film or a semiconductor film. Of these, a metal film is preferable since a high degree of reflectance can be realized in a wide range of visible rays from blue to red.

The reflectance of the metal film is determined by the thickness d, the complex refractive index $n-i\cdot\kappa$, and the surface roughness (RMS roughness) $\sigma$. A preferred material for the metal film has a small real part n and a small imaginary part $\kappa$ (corresponding to the light absorption coefficient) of the complex refractive index. Specific examples include Au, Nd, Ag, Cu, Mg, Al, Ni, Pd, and alloys thereof. If the thickness d is small, since light passes through the metal film, the reflectance decreases.

It is preferable that the thickness of the metal film be 5 nm or more, although the thickness varies depending on the value of the imaginary part $\kappa$ of the complex refractive index of the metal used.

If the surface roughness $\sigma$ is large, light is reflected irregularly, and hence, the amount of the light component which is reflected in a direction perpendicular to the emitting surface of the organic EL device is reduced. To avoid this problem, it is preferred that the surface roughness $\sigma$ be less than 10 nm, more preferably less than 5 nm.

The semitransparent electrode has a transmittance to light to be outcoupled outside the device of preferably 30% or more, more preferably 50% or more.

The semitransparent electrode has a reflectance to light to be outcoupled outside the device of preferably 20% or more, more preferably 40% or more.

5. Gas Barrier Layer

To prevent water or oxygen from entering the organic emitting layer, it is preferred that a gas barrier layer be provided so as to cover the secondary electrode. The gas barrier layer is normally formed of a transparent insulator. Preferably, the gas barrier layer has a structure in which a desiccant, a dry gas, an inert liquid such as fluorinated hydrocarbon or the like is sealed. If the material is highly moisture-proof, it is preferred that the gas barrier layer be an inorganic oxide layer, an inorganic nitride layer, or an inorganic oxygen nitride layer. As examples, silica, alumina, AlON, SiAlON, SiNx or the like can be given.

The organic EL color light-emitting apparatus of the invention can be produced by a known method. Specifically, the organic EL color light-emitting apparatus of the invention can be formed into a film with a prescribed thickness by sputtering or vacuum vapor deposition, followed by patterning to a desired shape by photolithography or the like.

EXAMPLES

The invention will be described in more detail according to the following examples.

Example 1

On a 0.7 mm-thick glass substrate, an organic EL device emitting blue light, an organic EL device emitting green light, and an organic EL device emitting red light were formed, whereby a color light-emitting apparatus was fabricated. Evaluation was made on the case where the thicknesses of the hole-transporting layer (first carrier-transporting layer) and the electron-transporting layer (second carrier-transporting layer) were varied to allow the position of the organic emitting layer in the organic luminescent medium layer to be changed.

The structures of the compounds used in the device are shown below.

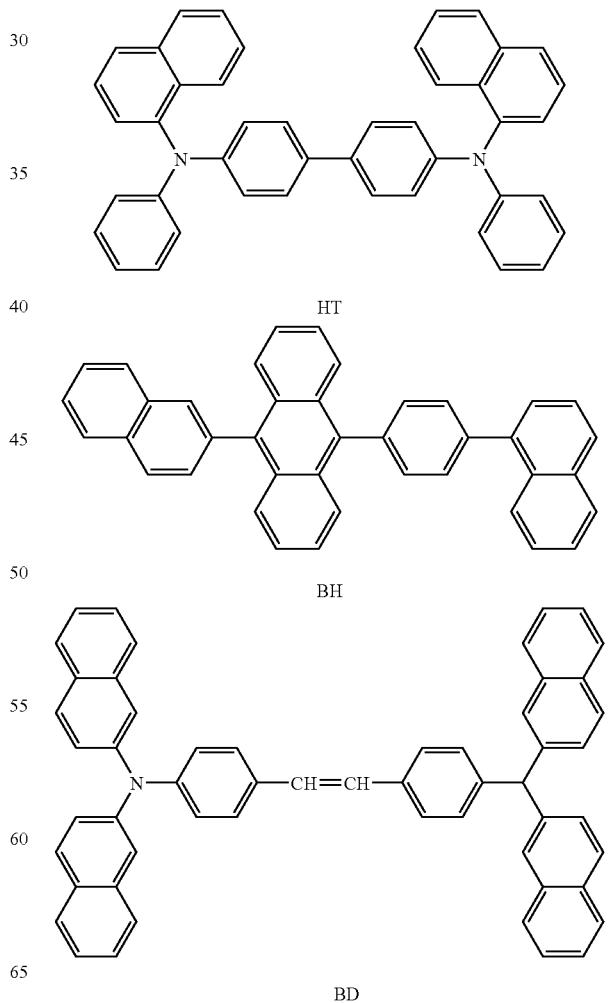

HT

BH

BD

-continued

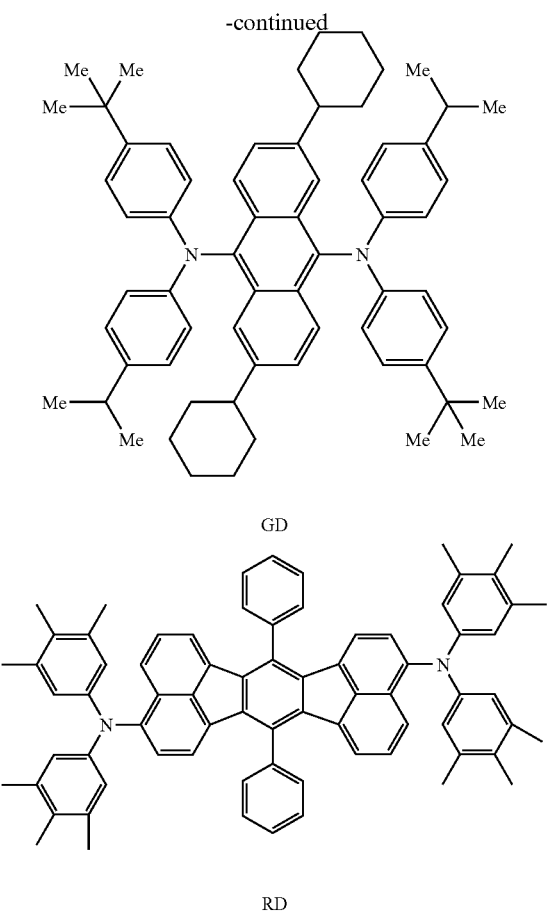

GD

RD

[Fabrication of a Light-Reflective Electrode]

ITO was deposited by sputtering to a thickness of 100 nm on a 0.7 mm-thick glass substrate as a primer layer. Subsequently, a film of aluminum was formed in a thickness of 150 nm by sputtering, and a film of ITO was formed thereon in a thickness of 10 nm by sputtering. The resultant aluminum/ITO film functioned as a light-reflective electrode common to all of the organic EL devices, i.e. the first organic EL device, the second organic EL device and the third organic EL device.

[Preparation of Vacuum Vapor Deposition Apparatus]

The above substrate provided with the light-reflective electrode was subjected to ultrasonic cleaning in isopropyl alcohol for 5 minutes, and then cleaned with ultraviolet ozone for 30 minutes. The cleaned substrate with the light-reflective electrode was installed in a substrate holder of a vacuum vapor deposition apparatus.

In advance, HT as the hole-transporting material, BH as the host material of the emitting layer, BD as the blue emitting material, GD as the green emitting material, RD as the red emitting material, tris(8-quinolinol)aluminum ($Alq_3$) as the electron-transporting material, LiF as a buffer layer material, and Mg and Ag as the light-reflective layer material were placed in each of a molybdenum heating boat. Further, as the transparent electrode, an ITO target was installed in another sputtering apparatus.

[Fabrication of First Organic EL Device]

An HT film which functioned as the hole-transporting layer was formed in a thickness of x nm. After forming the HT film, as the blue emitting layer, the compound BH and the compound BD were co-deposited in a thickness of 30 nm at a thickness ratio of 30:1.5. On the film, as the electron-transporting layer, an $Alq_3$ film was deposited in a thickness of 175-x nm. Thereafter, LiF as the buffer layer was deposited in a thickness of 1 nm. On the LiF film, an Mg:Ag film which functioned as the light-reflective layer was deposited in a thickness of 10 nm with a film-forming ratio of Mg and Ag of 9:1. Further, a film of ITO which functioned as the transparent electrode was formed in a thickness of 100 nm. Here, x was varied in 15 steps at an interval of 10 nm from 20 nm to 160 nm such that the total thickness of the organic luminescent medium layer became 205 nm. As a result, 15 types of organic EL device were fabricated as the first organic EL device.

[Fabrication of Second Organic EL Device]

First, an HT film which functioned as the hole-transporting layer was formed in a thickness of y nm. After forming the HT film, as the green emitting layer, the compound BH and compound GD were co-deposited in a thickness of 30 nm at a thickness ratio of 30:2.3. On the film, as an electron-transporting layer, an $Alq_3$ film was deposited in a thickness of 220-y nm. Thereafter, LiF as the buffer layer was deposited in a thickness of 1 nm. On the LiF film, an Mg:Ag film which functioned as the light-reflective layer was deposited in a thickness of 10 nm with a film-forming ratio of Mg and Ag of 9:1. Further, a film of ITO which functioned as the transparent electrode was formed in a thickness of 100 nm. Here, the light-reflective layer formed of Mg and Ag and the transparent electrode formed of ITO were the same as the first organic EL device. Here, y was varied in 20 steps at an interval of 10 nm from 20 nm to 210 nm such that the total thickness of the organic luminescent medium layer became 250 nm. As a result, 20 types of organic EL device were fabricated as the second organic EL device.

[Fabrication of Third Organic EL Device]

First, an HT film which functioned as the hole-transporting layer was formed in a thickness of z nm.

After forming the HT film, as the blue emitting layer, the compound BH and compound RD were co-deposited in a thickness of 30 nm at a thickness ratio of 30:1.5. On the film, as the electron-transporting layer, an Alq film was deposited in a thickness of 90-z nm. Thereafter, LiF as the buffer layer was deposited in a thickness of 1 nm. On the LiF film, an Mg:Ag film which functioned as the light-reflective layer was deposited in a thickness of 10 nm with a film-forming ratio of Mg and Ag of 9:1. Further, a film of ITO which functioned as the transparent electrode was formed in a thickness of 100 nm. Here, the light-reflective layer formed of Mg and Ag and the transparent layer formed of ITO were the same as the first organic EL device and the second organic EL device. Here, z was varied in 12 steps at an interval of 5 nm from 25 nm to 80 nm such that the total thickness of the organic luminescent medium layer became 120 nm. As a result, 12 types of organic EL device were fabricated as the third organic EL device.

The fluorescent spectrum of the organic emission layer was measured by the following method.

On a 0.7 mm-thick glass substrate, as the blue-emitting layer, the compound BH and the compound BD were co-deposited in a thickness of 100 nm at a thickness ratio of 100:5. Subsequently, on another 0.7 mm-thick glass substrate, as the green emitting layer, the compound BH and the compound GD were co-deposited in a thickness of 100 nm at a thickness ratio of 100:7.5. Further, on still another 0.7 mm-glass substrate, as the red emitting layer, the compound BH and the compound RD were co-deposited in a thickness of 100 nm at a thickness ratio of 100:5.

Subsequently, the surface of the blue-emitting layer was irradiated with monochromatic light having a wavelength of 410 nm, and the fluorescence emitted from the emitting layer was measured using a spectrophotometer. As a result, it was found that the peak wavelength of the fluorescence emitting from the blue emitting layer was 454 nm. Then, the surface of the red-emitting layer was irradiated with monochromatic light having a wavelength of 410 nm, and the fluorescence emitted from the emitting layer was measured using a spectrophotometer. As a result, it was found that the peak wavelength of the fluorescence emitting from the green emitting layer was 528 nm. Then, the surface of the green-emitting layer was irradiated with monochromatic light having a wavelength of 520 nm, and the fluorescence emitted from the emitting layer was measured using a spectrophotometer. As a result, it was found that the peak wavelength of the fluorescence emitting from the red emitting layer was 599 nm.

A single-layer film formed only of each of the layers used in the organic EL device was formed on the glass substrate, the refractive index and the phase shift on the electrode surface (value at a peak wavelength of fluorescence emitted from each of the blue, green, and red-emitting layers) were measured using a spectroellipsometer. The refractive index of the material constituting each of the organic EL devices and the phase shift value on the interface of the light-reflective electrode (Al/ITO) and the phase shift value on the light-reflective layer (Mg:Ag) are shown in Table 1.

TABLE 1

| Device | Wavelength of emission peak [nm] | Refractive index of HT | Refractive index of BH | Refractive index of $Alq_3$ | Al/ITO phase shift [radian] | Mg:Ag phase shift [radian] |
| --- | --- | --- | --- | --- | --- | --- |
| First (Blue) | 454 | 1.93 | 1.90 | 1.83 | −3.83 | −0.95 |
| Second (Green) | 528 | 1.85 | 1.80 | 1.72 | −3.71 | −0.91 |
| Third (Red) | 599 | 1.80 | 1.75 | 1.67 | −3.62 | −0.88 |

Since the refractive index differs between HT and $Alq_3$, the optical thickness Lx and the value of mx of the organic luminescent medium layer varied according to the thickness of the hole-transporting layer and the thickness of the electron-transporting layer. The range of such a variation is shown in Table 2.

Electric current was passed through each of the organic EL devices thus obtained such that the current density became 10 $mA/cm^2$. The luminance and the chromaticity were measured using the spectroradiometer (CS1000A, manufactured by Konica Minolta Holdings, Inc.). From the measured luminance, the luminous efficiency (unit: cd/A) was calculated.

Figure 5:
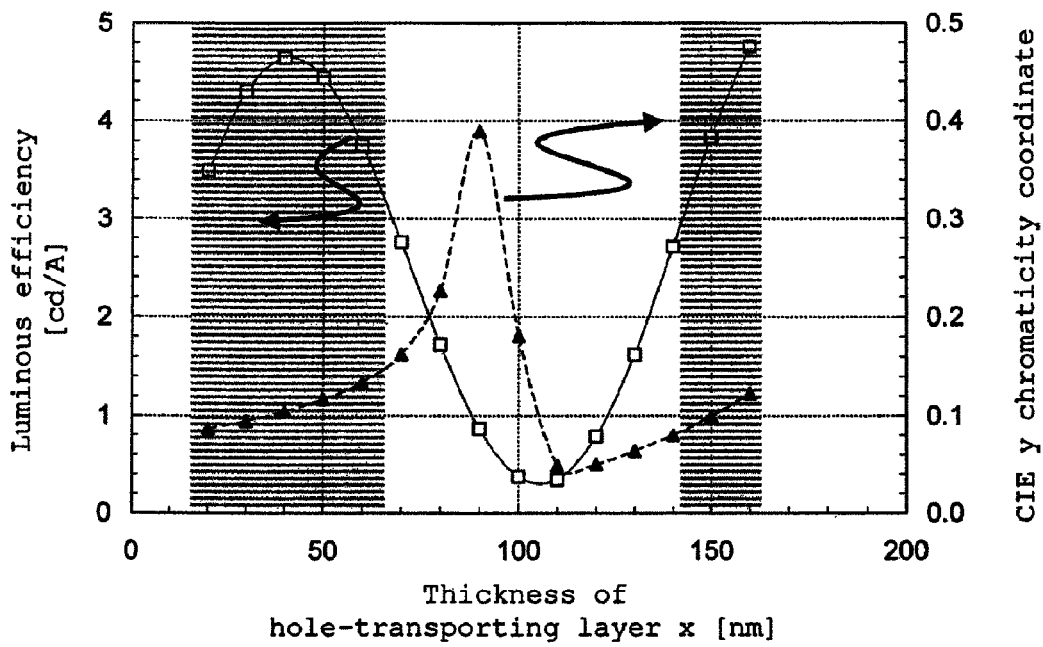
FIG. 5 is a graph showing a relationship between the thickness (x) of the hole-transporting layer (HT), the luminous efficiency, and the CIE y chromaticity coordinate of the first organic EL device.

FIG. 5 is a graph showing a relationship between the thickness (x) of the hole-transporting layer (HT), the luminous efficiency, and the CIE y chromaticity coordinate of the first organic EL device.

Figure 6:
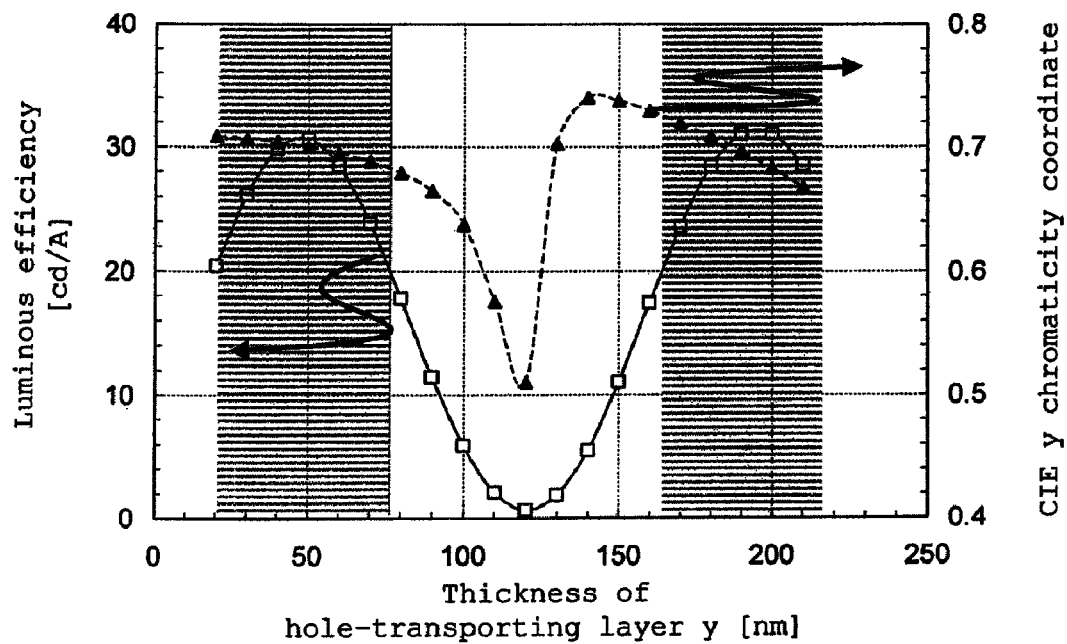
FIG. 6 is a graph showing a relationship between the thickness (y) of the hole-transporting layer (HT), the luminous efficiency, and the CIE y chromaticity coordinate of the second organic EL device.

FIG. 6 is a graph showing a relationship between the thickness (y) of the hole-transporting layer (HT), the luminous efficiency, and the CIE y chromaticity coordinate of the second organic EL device.

Figure 7:
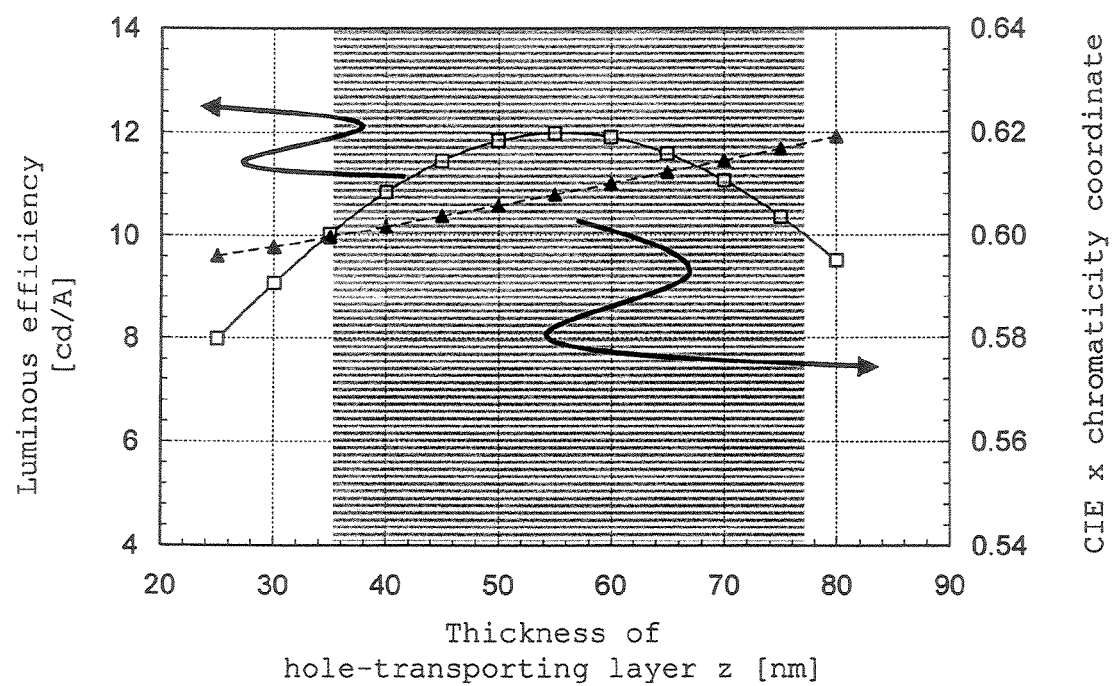
FIG. 7 is a graph showing a relationship between the thickness (z) of the hole-transporting layer (HT), the luminous efficiency, and the CIE x chromaticity coordinate of the third organic EL device.

FIG. 7 is a graph showing a relationship between the thickness (z) of the hole-transporting layer (HT), the luminous efficiency, and the CIE x chromaticity coordinate of the third organic EL device.

An area shown by the half tone dot in FIGS. 5 to 7 indicates an area having a high luminous efficiency and an excellent chromaticity of blue, green, and red. For example, in FIG. 5 (blue emission), the half tone dotted area indicates an area having a luminous efficiency of 3 cd/A or more and a CIE y chromaticity coordinate of 0.15 or less. In FIG. 6 (green emission), the half tone dotted area indicates an area having a luminous efficiency of 20 cd/A or more and a CIE y chromaticity coordinate of 0.65 or more. In FIG. 7 (red emission), the half tone dotted area indicates an area having a luminous efficiency of 10 cd/A or more and a CIE x chromaticity coordinate of 0.60 or more.

As is understood from FIGS. 5 to 7, in this example, the interference effect caused by the optical resonator can be utilized by allowing the thickness (x, y, z) of the hole-transporting layer (HT) to be common within a range of 35 nm to 65 nm, or by allowing the thickness (175-x, 220-y, 90-z) of the electron-transporting layer ($Alq_3$) to be common within a range of 10 nm to 30 nm. As a result, the device could be used in a state where a high luminous efficiency and a high degree of color purity can be attained.

The third organic EL device emitting red light and other devices emitting light with a shorter wavelength were allowed to have m values in the formula (1) differing from each other.

TABLE 2

| Device | Total thickness of organic luminescent medium layer [nm] | Minimum thickness of HT [nm] | Maximum thickness of HT [nm] | Minimum value of Lx [nm] | Maximum value of Lx [nm] | Minimum value of mx | Maximum value of mx |
| --- | --- | --- | --- | --- | --- | --- | --- |
| First (blue) | 205 | 20 | 160 | 370 | 385 | 0.87 | 0.93 |
| Second (green) | 260 | 20 | 210 | 436 | 459 | 0.92 | 1.01 |
| Third (red) | 120 | 25 | 80 | 206 | 213 | −0.03 | −0.01 |

HT: Hole-transporting layer
Lx: Optical thickness of the organic luminescent medium layer of the xth organic EL device
mx: Value of m in the formula (2) of the xth organic EL device
The stacked layer structure in each of the organic EL device is shown below.
*First organic EL device (blue emission)
Al (150 nm)/ITO (10 nm)/HT (x nm)/BH:BD (thickness ratio: 30:1.5, 30 nm)/$Alq_3$ (175 − x nm)/LiF (1 nm)/Mg:Ag (10 nm)/ITO (100 nm)
*Second organic EL device (green emission)
Al (150 nm)/ITO (10 nm)/HT (y nm)/BH:GD (thickness ratio: 30:2.3, 30 nm)/$Alq_3$ (220 − y nm)/LiF (1 nm)/Mg:Ag (10 nm)/ITO (100 nm)
*Third organic EL device (red emission)
Al (150 nm)/ITO (10 nm)/HT (z nm)/BH:RD (thickness ratio: 30:1.5, 30 nm)/$Alq_3$ (90 − z nm)/LiF (1 nm)/Mg:Ag (10 nm)/ITO (100 nm)

As a result, it was possible to make the total thickness of the organic luminescent medium layer of these devices thick enough, whereby occurrence of a short circuit between the electrodes could be prevented.

If the thickness of the electron-transporting layer was fixed to 20 nm in the above color light-emitting apparatus, i.e. if the thickness (x) of the hole-transporting layer (HT) was set to 150 nm, the thickness (y) of the hole-transporting layer was set to 200 nm, and the thickness (z) of the hole-transporting layer was set to 70 nm, the CIE chromaticity coordinates and the luminous efficiency (L/J) are shown in Table 3.

TABLE 3

|  | CIEx | CIEy | L/J [cd/A] |
|---|---|---|---|
| Blue | 0.123 | 0.108 | 4.2 |
| Green | 0.287 | 0.683 | 31.0 |
| Red | 0.610 | 0.389 | 11.9 |

It can be understood that a full-color light-emitting apparatus which can emit blue, green, and red colors which are highly pure and well-balanced in chromaticity can be fabricated even when the thickness of the electron-transporting layer is set to be the same.

INDUSTRIAL APPLICABILITY

The organic EL color light-emitting apparatus according to the invention may be used for various displays such as consumer televisions, large displays, and displays for portable telephones.

The invention claimed is:

1. An organic electroluminescent color light-emitting apparatus comprising, on a supporting substrate,
a first pixel comprising a first organic electroluminescent device emitting light having an emission peak wavelength of $\lambda_1$; and
a second pixel comprising a second organic electroluminescent device emitting light having an emission peak wavelength of $\lambda_2$;
the emission peak wavelength $\lambda_2$ being longer than $\lambda_1$;
the first and second organic electroluminescent devices each being a device in which a light-reflective electrode, an organic luminescent medium layer and a semitransparent electrode are stacked in this order in the light-outcoupling direction; and
$m_1$ and $m_2$ defined by the following formula (1) satisfying the relationship of $m_2+1.3>m_1>m_2+0.7$ ($m_1$ and/or $m_2$ is an approximate integer of 0 or more);

$$m_x = \frac{2L_x}{\lambda_x} + \frac{\Phi_x}{2\pi} \quad (1)$$

wherein Lx is an optical distance between a light-reflective electrode and a semitransparent electrode for light having a wavelength of λx; $\Phi_x$ is the total value of phase shifts which occur when light having a wavelength of $\lambda_x$ is reflected at the surface of the light-reflective electrode and at the surface of the semitransparent electrode; and x is 1 or 2, x=1 shows a value of the first organic electroluminescent device and x=2 shows a value of the second organic electroluminescent device.

2. An organic electroluminescent color light-emitting apparatus comprising, on a supporting substrate,
a first pixel comprising a first organic electroluminescent device emitting light having an emission peak wavelength of $\lambda_1$; and
a second pixel comprising a second organic electroluminescent device emitting light having an emission peak wavelength of $\lambda_2$;
a third pixel comprising a third organic electroluminescent device emitting light having an emission peak wavelength of $\lambda_3$;
the emission peak wavelength $\lambda_2$ being longer than $\lambda_1$ and the emission peak wavelength $\lambda_3$ being longer than $\lambda_2$;
the first, second and third organic electroluminescent devices each being a device in which a light-reflective electrode, an organic luminescent medium layer and a semitransparent electrode are stacked in this order in the light-outcoupling direction; and
$m_1$ and $m_3$ defined by the following formula (2) satisfying the relationship of $m_3+1.3>m_1>m_3+0.7$ ($m_1$ and/or $m_3$ is an approximate integer of 0 or more);

$$m_x = \frac{2L_x}{\lambda_x} + \frac{\Phi_x}{2\pi} \quad (2)$$

wherein Lx is an optical distance between a light-reflective electrode and a semitransparent electrode for light having a wavelength of $\lambda_x$; $\Phi_x$ is the total value of phase shifts which occur when light having a wavelength of $\lambda_x$ is reflected at the surface of the light-reflective electrode and at the surface of the semitransparent electrode; and x is 1 or 3, x=1 shows a value of the first organic electroluminescent device and x=3 shows a value of the third organic electroluminescent device.

3. The organic electroluminescent color light-emitting apparatus according to claim 1, wherein the organic luminescent medium layers comprise a device in which at least a first carrier-transporting layer, an organic emitting layer and a second carrier-transporting layer stacked in this order in the light-outcoupling direction; and, in the first and the second pixels, distances between the organic emitting layers and the semitransparent electrodes are almost equal.

4. The organic electroluminescent color light-emitting apparatus according to claim 2, wherein the organic luminescent medium layers comprise at least a first carrier-transporting layer, an organic emitting layer and a second carrier-transporting layer stacked in this order in the light-outcoupling direction; and, in the first to third pixels, distances between the organic emitting layers and the semitransparent electrodes are almost equal.

5. The organic electroluminescent color light-emitting apparatus according to claim 1, wherein the organic luminescent medium layers comprise at least a first carrier-transporting layer, an organic emitting layer and a second carrier-transporting layer stacked in this order in the light-outcoupling direction; and, in the first and second pixels, distances between the light-reflective electrodes and the organic emitting layers are almost equal.

6. The organic electroluminescent color light-emitting apparatus according to claim 2, wherein the organic luminescent medium layers comprise at least a first carrier-transporting layer, an organic emitting layer and a second carrier-transporting layer stacked in this order in the light-outcoupling direction; and, in the first to third pixels, distances between the light-reflective electrodes and the organic emitting layers are almost equal.

* * * * *